(12) United States Patent
Benveniste et al.

(10) Patent No.: US 8,263,941 B2
(45) Date of Patent: Sep. 11, 2012

(54) MASS ANALYSIS MAGNET FOR A RIBBON BEAM

(75) Inventors: Victor Benveniste, Lyle, WA (US);
James S. Buff, Brookline, NH (US);
Frank Sinclair, Quincy, MA (US);
Joseph C. Olson, Beverly, MA (US)

(73) Assignee: Varian Semiconductor Equipment Associates, Inc., Gloucester, MA (US)

(*) Notice: Subject to any disclaimer, the term of this patent is extended or adjusted under 35 U.S.C. 154(b) by 448 days.

(21) Appl. No.: 12/616,589

(22) Filed: Nov. 11, 2009

(65) Prior Publication Data
US 2010/0116983 A1    May 13, 2010

Related U.S. Application Data

(60) Provisional application No. 61/114,312, filed on Nov. 13, 2008.

(51) Int. Cl.
*H01J 49/20* (2006.01)
(52) U.S. Cl. .......... 250/396 ML; 250/492.1; 250/492.2; 250/492.21; 250/492.22; 250/492.3
(58) Field of Classification Search .............. 250/396 R, 250/492.1–492.3
See application file for complete search history.

(56) References Cited

U.S. PATENT DOCUMENTS

| | | | |
|---|---|---|---|
| 4,958,078 A | 9/1990 | Becchetti | |
| 6,160,262 A | 12/2000 | Aoki et al. | |
| 6,498,348 B2 | 12/2002 | Aitken | |
| 6,635,880 B1 * | 10/2003 | Renau | 250/396 ML |
| 6,770,888 B1 | 8/2004 | Benveniste et al. | |
| 6,835,930 B2 | 12/2004 | Benveniste et al. | |
| 7,112,789 B2 | 9/2006 | White et al. | |
| 2005/0258380 A1 | 11/2005 | White et al. | |
| 2008/0029716 A1 | 2/2008 | Chen | |
| 2008/0078956 A1 * | 4/2008 | Satoh | 250/492.21 |

OTHER PUBLICATIONS

Jennings, John C.E., et al., A Magnetic Lens Coincidence Spectrometer with Reduced Spherical Aberration, Nuclear Instruments and Methods, Jan. 1, 1977, pp. 37-38, vol. 140, Issue 1, North-Holland Publishing Co.

Aitken, Derek, Very High Uniformity Mass Analysed Large Area Ion Implantation, Nuclear Instruments and Methods in Physics Research, Section B, Aug. 2005, pp. 250-255, vol. 237, Issues 1-2, Elsevier B.V.

* cited by examiner

*Primary Examiner* — Michael Maskell

(57) ABSTRACT

A ribbon beam mass analyzer having a first and second solenoid coils and steel yoke arrangement. Each of the solenoid coils have a substantially "racetrack" configuration defining a space through which an ion ribbon beam travels. The solenoid coils are spaced apart along the direction of travel of the ribbon beam. Each of the solenoid coils generates a uniform magnetic field to accommodate mass resolution of wide ribbon beams to produce a desired image of ions generated from an ion source.

27 Claims, 14 Drawing Sheets

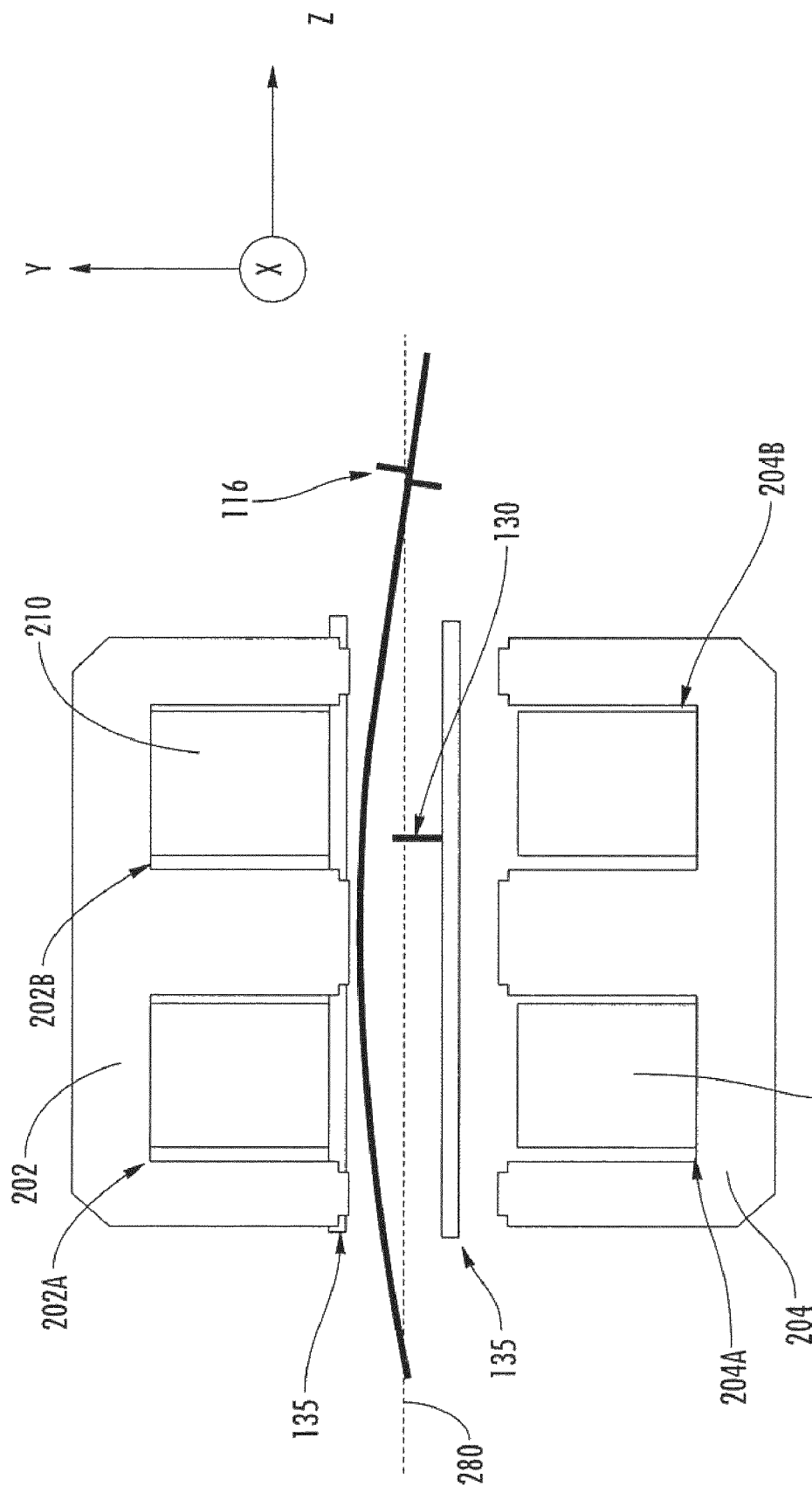

MASS ANALYSIS MAGNET FOR A RIBBON BEAM

CROSS-REFERENCE TO RELATED APPLICATIONS

This application claims priority to U.S. Provisional Patent Application No. 61/114,312 filed Nov. 13, 2008, which is expressly incorporated by reference herein in its entirety.

BACKGROUND OF THE INVENTION

1. Field of the Invention

Embodiments of the invention relate to the field of semiconductor device fabrication. More particularly, the present invention relates to mass analysis magnets for ion ribbon beams used in an ion implanter used for semiconductor and other device fabrication.

2. Discussion of Related Art

In general, a beamline ion implanter provides an ion beam for treating a workpiece to obtain desired device characteristics. In one application, the workpiece is a semiconductor wafer where the ion beam dopes the semiconductor wafer with particular desired impurities. In other applications, the ion beam may provide for precise material modification to the workpiece. In addition to semiconductor wafers, the workpiece may also include, but not be limited to, flat panels, solar panels, and polymer substrates.

An ion implanter generally includes an ion source chamber which generates a plasma from which an ion beam is extracted by an extraction electrode assembly. The ion beam may then be directed towards a mass analysis magnet configured with a particular magnetic field such that only the ions with a desired charge to mass ratio travel through the mass analyzer. The mass analyzed ion beam may then be manipulated by other beam line elements known to those in the art including a corrector magnet and acceleration and deceleration lenses to direct the beam towards a surface of the workpiece. The ion beam may be distributed across the surface of the workpiece by ion beam movement, workpiece movement, or a combination of the two. The ions lose energy when they collide with electrons and nuclei in the workpiece and come to rest at a desired depth within the workpiece based on the acceleration energy.

FIG. 12 illustrates a conventional mass analysis magnet 1 having a pair of pole pieces 2 that define a gap 3 through which an ion beam 4 passes. The two pole pieces 2 create a dipole magnetic field that provides a bending force to the ion beam 4 traveling through the gap. The amount of bend varies slightly for different ion species of the beam depending on the charge state, energy, and mass of the ions. The magnetic field created between the pole pieces 2 of the conventional magnet is parallel to the direction of image/focus formed by the magnet. The mass of an ion relative to the charge of the ion affects the degree to which the ion is accelerated transversely by the magnetic field formed between the two pole pieces. Thus, as the ion beam from the ion source travels through the conventional mass analysis magnet, different ion species travel different trajectories and the mass analysis magnet selects the ions having the trajectories associated with the desired mass to charge ratio. A mass resolving slit positioned downstream from the mass analyzer magnet, selects the desired species (e.g., B+) while undesired species are collected by a conductive plate surrounding the mass resolving slit. The ions having a slightly lower ion mass (deflected through a larger angle) or ions having a slightly higher mass (deflected through a smaller angle) are not transmitted. The majority of these magnetic analyzers also orient the long direction of the ribbon beam to be parallel to the dipole field. However, the size of the ion beam accommodated by these mass analyzer magnets is limited by the size of the pole gap.

With the continuing increases in the size of some workpieces (e.g., semiconductor wafer disk sizes may increase from 300 millimeters (mm) in diameter to 450 mm and even greater) and to permit flexibility to treat workpieces of different sizes, it is advantageous to increase the width of the ion beam to a ribbon beam. A ribbon beam is an ion beam having a ribbon shape or a shape where a first dimension of the ribbon beam along one direction is larger than a second dimension of the beam along a second direction orthogonal to the first direction. The ribbon beam may have a generally rectangular cross sectional shape where the width of the ribbon beam is at least three times greater than its height.

The conventional mass analysis magnet that bends different ions at different trajectories has a limited magnetic field strength which decreases as the magnet pole gap increases. In other words, the magnetic field is inversely proportional to the width of the beam. The uniformity of the field across the width of the beam is also degraded by increasing the pole gap. Since the amount of bend varies slightly for different ion species of the beam, the non-uniform magnetic field affects the mass analysis of the ion trajectories as they travel through the magnetic field, thereby causing undesirable mass analysis results. In order to accommodate wider ribbon beams of the same mass and energy, this conventional mass analysis magnet would require a larger bend radius and hence a longer path length. This results in a larger physical magnet requiring more power supply voltage to drive a desired current through the magnet to provide a particular magnetic field strength across the gap. However, at a certain size the magnet becomes saturated and the magnetic field remains non-uniform. Consequently, the size, cost, and power consumption of a conventional mass analysis magnet would increase. Another type of mass analysis apparatus may be found in U.S. Pat. No. 6,498,348 which employs an array of elongated magnetic poles where the magnetic poles are configured in a plane perpendicular to an ion beam moving parallel to an array elongation direction. Thus, the magnetic field is perpendicular to both the width of the ribbon beam (X axis) and the direction of the beam image (Z axis). However, this type of magnet is wound around the height (Y Axis) of the ribbon beam traveling through the magnet and requires large sideways motions of the ribbon beam in order to operate. This increases the size of the magnet and also the distance that the ion beam must travel leading to increased losses in ion beam current.

Accordingly, there is a need in the art for an improved mass analysis magnet which scales well with increasing ribbon beam widths that overcomes the above-described inadequacies and shortcomings. There is also a need in the art for a mass analyzer magnet architecture that provides a uniform magnetic field which remains invariant across the width of a ribbon beam.

SUMMARY OF THE INVENTION

Exemplary embodiments of the present disclosure are directed to a mass analyzer magnet used in beamline ion implanters for performing mass analysis of different ion species within a traveling ribbon ion beam. In an exemplary embodiment, a mass analyzer includes a first solenoid coil defining an entrance space adapted to receive the ion ribbon beam and an exit space adapted to output the ion ribbon beam. The first solenoid coil is configured to generate a first magnetic field in response to an applied current to alter a trajectory of ions within the ion ribbon beam traveling through the first solenoid coil based on a respective mass of each of the ions. The mass analyzer includes a second solenoid coil spaced a distance "d" from the first solenoid coil along the traveling path of the ion ribbon beam. The second solenoid coil defines an entrance space adapted to receive the ion ribbon beam from the exit space of the first solenoid coil. The second solenoid coil is configured to generate a second magnetic field in response to applied current such that said second magnetic field is in an opposite direction from said first magnetic field. The second solenoid coil bends the trajectory of the ions within the ion ribbon beam based on the respective mass of each of the ions. The mass analyzer also includes at least one yoke having a first recess and a second recess. The first recess is configured to receive a portion of the first solenoid coil and the second recess is configured to receive a portion of the second solenoid coil. The yoke is in contact with and completes a circuit formed between the yoke, the first solenoid coil and the second solenoid coil.

In another exemplary embodiment, an ion implantation system includes an ion source, a mass analyzer and an end station. The ion source is operable to generate an ribbon ion beam. The mass analyzer has an entrance and an exit and is configured to receive a traveling ion ribbon ion beam from the ion source via the entrance and deflect ions within the ribbon beam having a desired charge-to-mass ratio along a predetermined path for output to the exit of the mass analyzer. The mass analyzer comprises a first and second solenoid coils spaced a specified distance apart along the traveling direction of the ion ribbon beam. Each of the solenoid coils define a space through which the ribbon ion beam travels. A yoke has a first recess adapted to receive a first portion of the first solenoid coil and a second recess adapted to receive a first portion of the second solenoid coil. The end station is downstream of the mass analyzer and is configured to support a workpiece for implantation thereof via the ribbon beam.

BRIEF DESCRIPTION OF THE DRAWINGS

For a better understanding of the present disclosure, reference is made to the accompanying drawings, in which like elements are referenced with like numerals, and in which:

FIG. 2A is a cross sectional view taken along lines 2A-2A shown in FIG. 2 in accordance with an embodiment of the present disclosure.

DETAILED DESCRIPTION

Figure 1A:
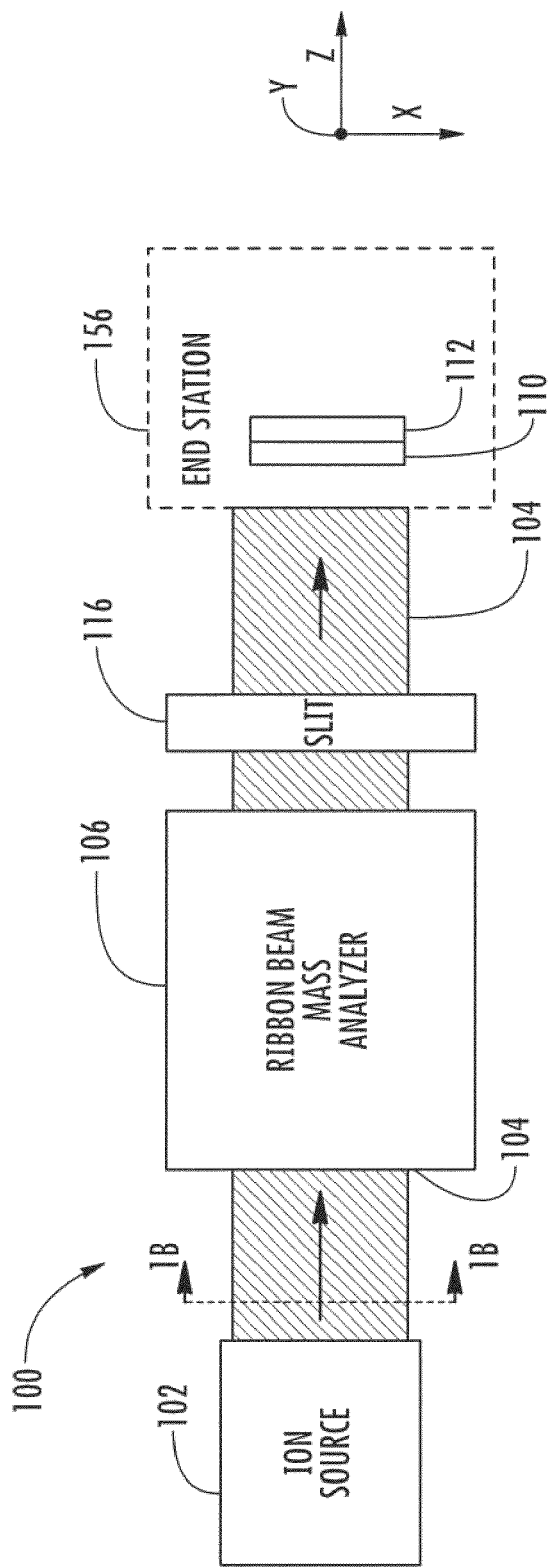
FIG. 1A is plan view of a beamline ion implanter having a ribbon beam mass analyzer in accordance with an embodiment of the present disclosure.

The present invention will now be described more fully hereinafter with reference to the accompanying drawings, in which preferred embodiments of the invention are shown. This invention, however, may be embodied in many different forms and should not be construed as limited to the embodiments set forth herein. Rather, these embodiments are provided so that this disclosure will be thorough and complete, and will fully convey the scope of the invention to those skilled in the art. In the drawings, like numbers refer to like elements throughout.

FIG. 1A is a plan view of a simplified block diagram of a beamline ion implanter 100 having a ribbon beam mass analyzer 106 consistent with an embodiment of the disclosure. The beamline ion implanter 100 includes an ion source chamber 102 which generates ions of a desired species based on a particular feed gas introduced into the chamber. An extraction assembly, not shown, includes a plurality of electrodes configured to generate an electric field. The strength of the electric field is tuned to a desired beam current to extract a particular type of ion ribbon beam 104 from the ions generated in ion source chamber 102. A mass resolving slit 116 is positioned downstream from the ribbon beam mass analyzer 106 which is configured to select ions having particular trajectories as they exit the mass analyzer magnet 106. An end station 156 may include a process chamber having a chuck 112 to support a workpiece 110 being treated by the ribbon beam 104. The workpiece 110 may be a disk shaped semiconductor wafer in one embodiment. The workpiece 110 may also include, but not be limited to, flat panels, solar panels, and polymer substrates. The end station 156 may also include a scanning system (not illustrated) for driving the workpiece 110 in a desired direction.

The end station 156 may also include additional components known to those skilled in the art. For example, the end station 156 typically includes automated workpiece handling equipment for introducing workpieces into the ion implanter 100 and for removing workpieces after ion implantation. It will be understood to those skilled in the art that the entire path traversed by the ribbon beam 104 is evacuated during ion implantation. The implanter 100 may also have a controller (not illustrated) to control a variety of subsystems and components of the implanter 100.

The beam 104 has a ribbon shape or a shape where a first dimension of the beam along one direction is larger than a second dimension of the beam along a second direction orthogonal to the first direction. In the embodiments described herein, it is helpful to define a Cartesian coordinate system where a centroid of the ribbon beam 104 defines the Z axis. An X-Y plane defined by an X and Y axis is orthogonal to the Z axis as is shown by the coordinate system of FIG. 1A.

Figure 1B:
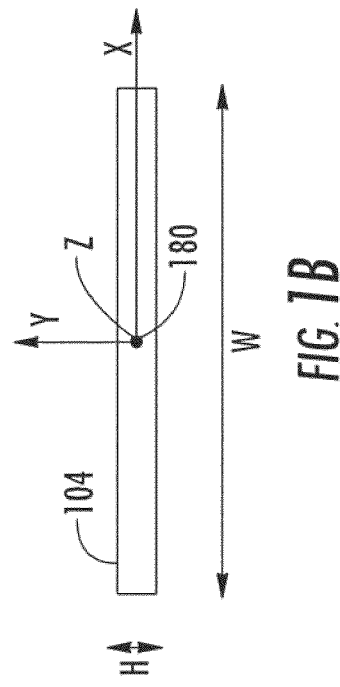
FIG. 1B is a cross sectional view of the ribbon beam of FIG. 1A taken along the line 1B-1B of FIG. 1A looking downstream in the direction of travel of the ribbon beam in accordance with an embodiment of the present disclosure.

FIG. 1B is a cross sectional view of the ribbon beam 104 of FIG. 1A taken along the line 1B-1B of FIG. 1A looking downstream in the direction of travel of the ribbon beam 104 with further reference to the defined coordinate system. In this instance, the ribbon beam 104 has a generally rectangular cross sectional shape. Those skilled in the art will recognize that the cross sectional shape of the ribbon beam may be a generally irregular shape approximating that illustrated in FIG. 1B. The ribbon beam 104 has a width (W) in the X direction and a height (H) in the Y direction. A centroid 180 of the ribbon beam 104 defines the Z axis and the beam travels in the Z direction from in source 102 to end station 156. Although the width (W) of the ribbon beam is positioned in the X direction in the embodiments described herein, the width (W) or long dimension of the ribbon beam may be positioned in any direction. For example, the long dimension of the ribbon beam 104 may also be positioned in the Y direction and other components would be repositioned accordingly.

In operation, an extraction electrode assembly (not illustrated) positioned proximate an aperture of the ion source 102 extracts the ribbon beam 104 from a plasma within the ion source 102. The extraction electrode assembly includes, for example, an arc slot electrode, suppression electrode and ground electrode which create an electric field having a particular strength tuned to a desired beam current to extract a particular type of ion beam from the ions generated in ion source 102. The ribbon beam 104 may have a width (W) in the X direction that can be accommodated by the ribbon beam mass analyzer 106. The ribbon beam mass analyzer 106 performs mass analysis of the ribbon beam 104 as will be further described herein so that the mass resolving slit 116 selects desired ions from the ribbon beam. The mass analyzed ribbon beam 104 may then be directed towards the workpiece 110. The workpiece 110 may be driven by a scanning system positioned in the end station 156 in a direction orthogonal to the long dimension of the ribbon beam 104 or the Y direction in this instance.

Figure 2:
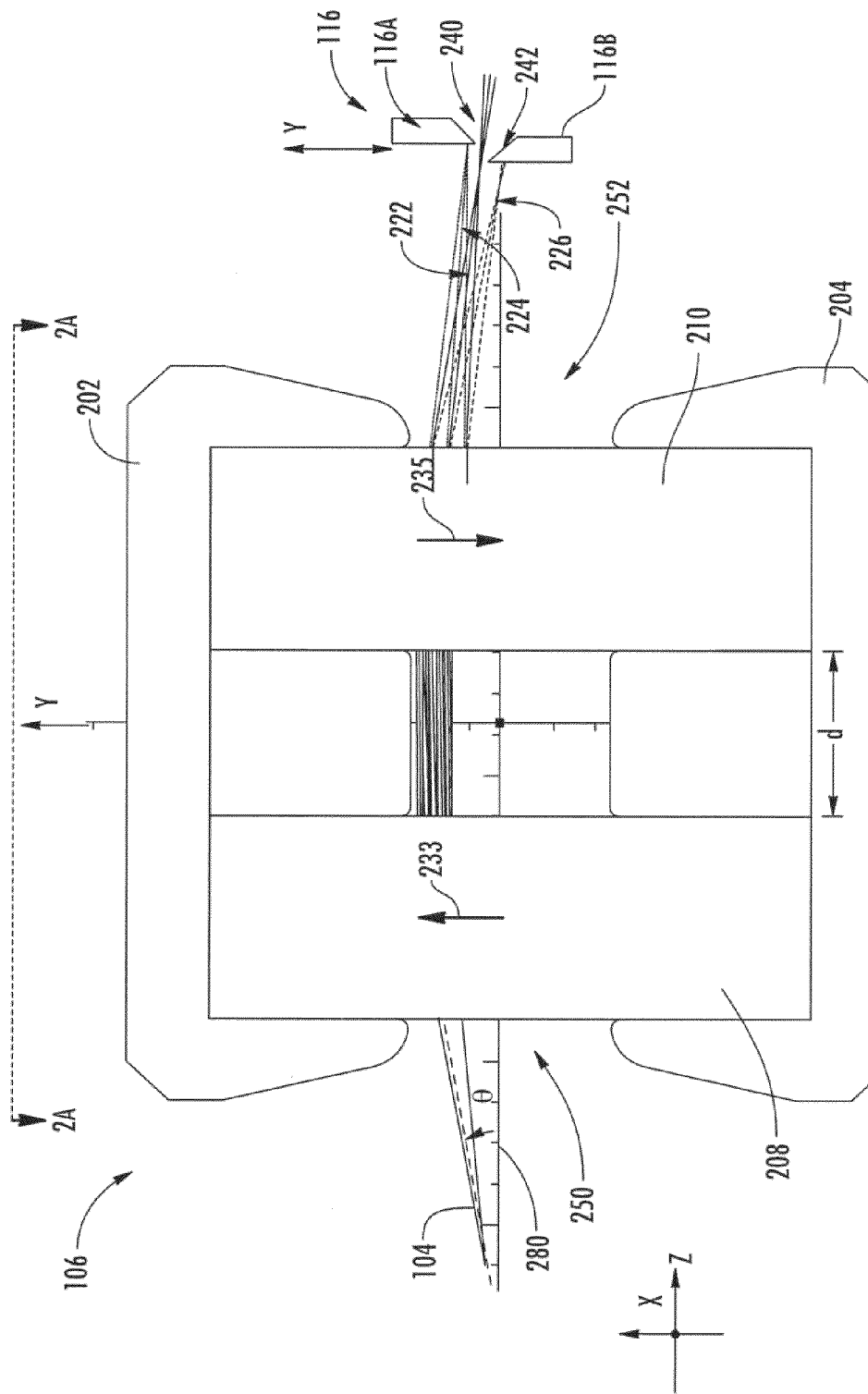
FIG. 2 is a side view of the ribbon beam mass analyzer of FIG. 1 in accordance with an embodiment of the present disclosure.

FIG. 2 is a side view of ribbon beam mass analyzer 106 of FIG. 1 in accordance with an exemplary embodiment of the present disclosure generally having an entrance end 250 and an exit end 252. The ribbon beam mass analyzer 106 includes a first solenoid coil 208 and a second solenoid coil 210 separated by a distance "d" and supported by an upper return yoke 202 and a lower return yoke 204. The yokes 202, 204 may be fabricated of ferromagnetic materials such as steel to provide a return circuit for the analyzer magnet. Each of the coils 208, 210 may have a "racetrack" shape as is more particularly illustrated in the perspective view of the coil 208 shown in FIG. 3. The coils 208, 210 are wound around the X axis in opposite directions to produce oppositely directed magnetic fields to accommodate for deflection/displacement of an ion beam traveling through the magnet as described in more detail below.

The solenoid coils 208 and 210 may have the same general shape or may be different depending on the desired magnetic field to select ions having a particular mass to charge ratio. An entrance opening 260 (see FIG. 3) for the ribbon beam 104 may be defined by the shape of the first solenoid coil 208 and an exit opening 252 may be defined by a shape of the second solenoid coil 210. One or more power supplies (not illustrated) provide the necessary voltage to drive current through the coils 208, 210 which flows in opposite directions therethrough as indicated by arrows 233, 235. Yokes 202 and 204 provide separation of the magnetic field lines between coils 208 and 210 to create desired magnetic fields as a consequence of the opposite current flow in directions 233 and 235 associated with each of the respective coils. In general, the two solenoid coils 208, 210 act as lenses to produce an image which is mass dependent to allow the opening 240 defined by the mass resolving slit 116 to select the image having the desired mass and to reject the images of other masses to thereby accomplish mass resolution.

As shown in FIG. 2, the ribbon beam 104 is aimed away from the midplane 280 of the ribbon beam mass analyzer 106 because the analyzer 106 does not alter trajectories of ions parallel to the axis in the midplane 280. In other words, no mass resolution occurs for ions in the midplane. The angle ($\theta$) of the ribbon beam 104 relative to the midplane 280 may be varied to provide a desired alteration of ion trajectories. In one embodiment, the angle ($\theta$) may be between about 7.5 and 8.0 degrees. In operation, the ribbon beam 104 is directed through the opening 260 defined by the first solenoid coil 208 at a vertical angle ($\theta$) relative to the midplane 280 of the analyzer 106. The magnetic field created by the current flowing through the first solenoid coil 208 in the direction shown by arrow 233 provides a first displacement/deflection in the X direction for the ribbon beam 104. The magnetic field created by the current flowing through the second solenoid coil 210 in the direction shown by arrow 235 provides a second deflection also in the X direction, but in the opposite direction as the displacement/deflection from the first solenoid coil 208. Thus, the deflections in the X direction caused by each of the solenoid coils cancel each other out through analyzer 106.

The magnetic field and associated deflections provides an image of the ribbon beam that is mass dependent. For example, a first portion 222 of the ribbon beam includes ions of a first mass, a second portion 224 of the ribbon beam includes ions of a second mass, and a third portion 226 includes ions of a third mass. The desired ions may then be selected by positioning the opening 240 of the mass resolving slit 116 corresponding to the particular portion of the ribbon beam with the desired mass. In the embodiment of FIG. 2, the mass resolving slit 116 may be fixed in a Z position where the opening 240 may be movable along the Y axis to a selected position. In another embodiment of the analyzer shown in FIG. 2, the center of the mass resolving slit 116 can be fixed in the Y and Z directions and the currents in the coils 208, 210 can be increased or decreased to position the ions with the desired mass within opening 240.

In the embodiment of FIG. 2, the opening 240 is positioned along the Y axis to select the first portion 222 of the mass analyzed ribbon beam. The size of the opening 240 may also be variable to accommodate different sized beams. The opening 240 may also be defined by a beveled edge 242 on one or more sides of the opening to permit a maximum passage of the desired portion of the ribbon beam. The upper 116A and lower 116B portions of the mass slit 116 may also be located at different Z positions to improve mass resolution. For instance, in FIG. 2 the maximum separation of the first portion 222 from the second portion 224 of the mass-analyzed ribbon beam occurs at a different Z position than does the maximum separation of the second portion 224 from the third portion 226. One or more actuators (not illustrated) may be mechanically coupled to the mass resolving slit 116 to drive it to a desired position and to alter the size of the opening 240.

Figure 8:
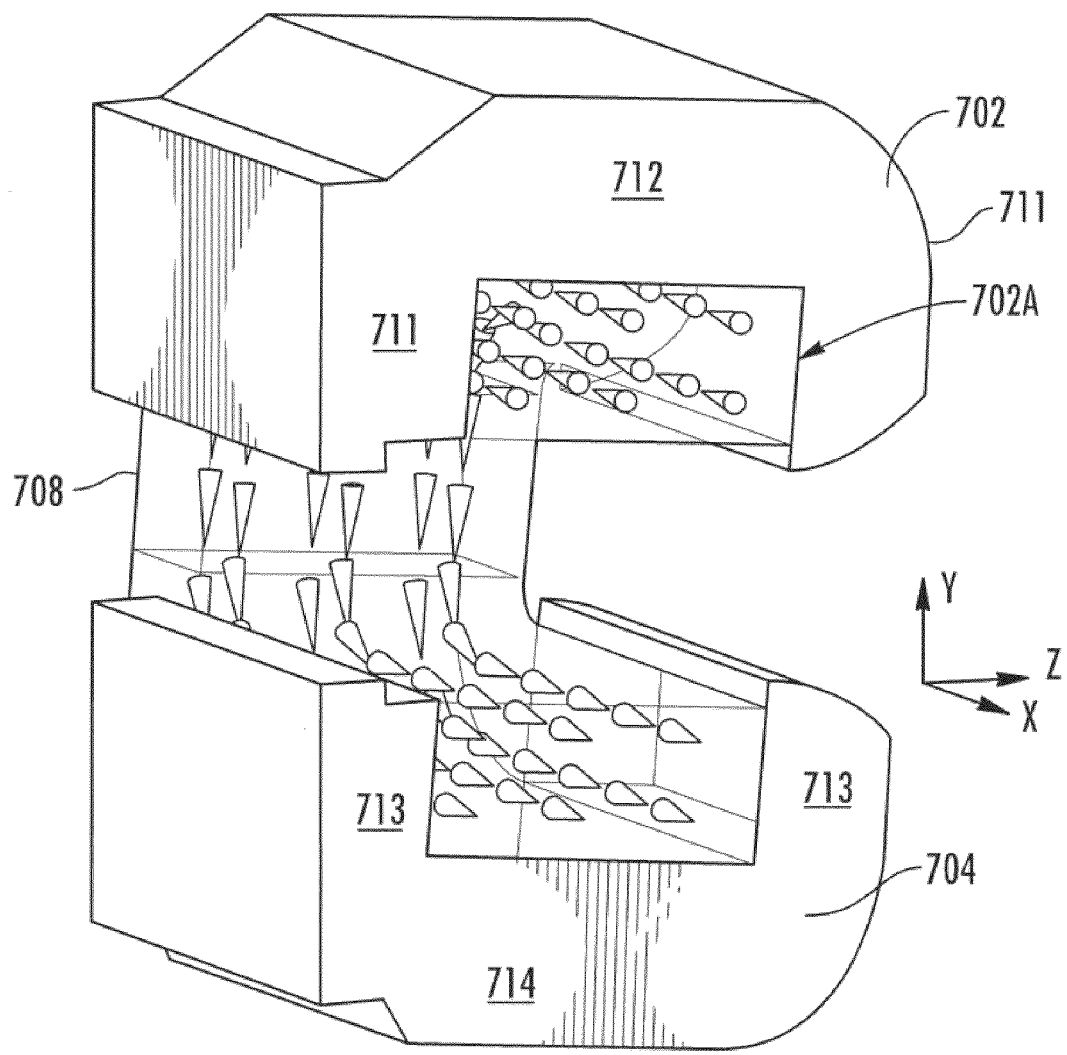
FIG. 8 is a perspective view of a return yoke consistent with the embodiment of FIG. 7.

Alternatively, the mass resolving slit may be tilted about the X axis to achieve the same effect. FIG. 8 shows a mass slit tilted in this manner.

FIG. 2A is a cross sectional simplified view taken along lines 2A-2A of the analyzer magnet 106 shown in FIG. 2. Yoke 202 includes a first recess 202A and a second recess 202B. Similarly, yoke 204 includes a first recess 204A and a second recess 204B. First solenoid 208 is partially disposed within recess 202A and 204A of yokes 202 and 204 respectively. Second solenoid 210 is partially disposed within recess 202B and 204B of yokes 202 and 204 respectively. Magnet 106 includes a vacuum vessel defined by walls 135 along the path of beam 104 in the Z direction with respect to midplane 280. A scraper 130 extends from vacuum vessel wall 135 in the Y direction a predetermined distance above the midplane 280 shown in FIG. 2 and across the width of beam 104 in the X direction. Scraper 130 has several functions. First, because the analyzer magnet 106 does not alter the trajectories of ions parallel to the axis in the midplane 280, the scraper 130 blocks the ions that are located along the midplane from exiting the exit end 252 toward mass slit 116. In addition, the optics of the solenoids 208, 210 are such that the ions are bent across the beam in the Y direction as they travel through the analyzer 106 with ions further from the midplane 280 bending slightly more than intended, causing a slight aberration in the focus. Typically, the ions with the greatest mass will be less bent by the analyzer 106 and therefore travel further away from the midplane 280 while the ions with a relatively lighter mass are closer to the midplane. However, when first solenoid 208 bends the trajectory of the ions in beam 104, the heavy ions furthest away from the midplane experience a slightly greater bend angle due to the aberration and bend back toward the desired beam trajectory and consequently selected by mass slit 116 even if these heavier ions do not have the mass associated with the desired beam. Scraper 130 accommodates for this aberration by removing these heavier ions before reaching mass slit 116. Similarly, lighter ions which are closer to the midplane than the heavier ions undergo less of a bend angle within magnet 106 causing these lighter ions to move back toward the trajectory of the desired mass. Scraper 130 removes these lighter ions before reaching mass slit 116. In addition, an additional portion of scraper 130 (not shown) may also extend from upper wall 135 which would provide an aperture therebetween configured to prevent the heavy ions from traveling along the beam path in the Z direction. Finally, the ions that do not have the desired mass are deposited on the walls 135 which are typically lined with graphite. Over time, the bombardment of the ions on walls 135 produces debris (e.g. bits of wall 135) which may travel toward end station 156. Scraper 130 is positioned to reduce the likelihood that this unwanted debris from the graphite lined walls 135 travels to the end station, thereby contaminating the desired doping profile of the workpiece 110.

Figure 3:
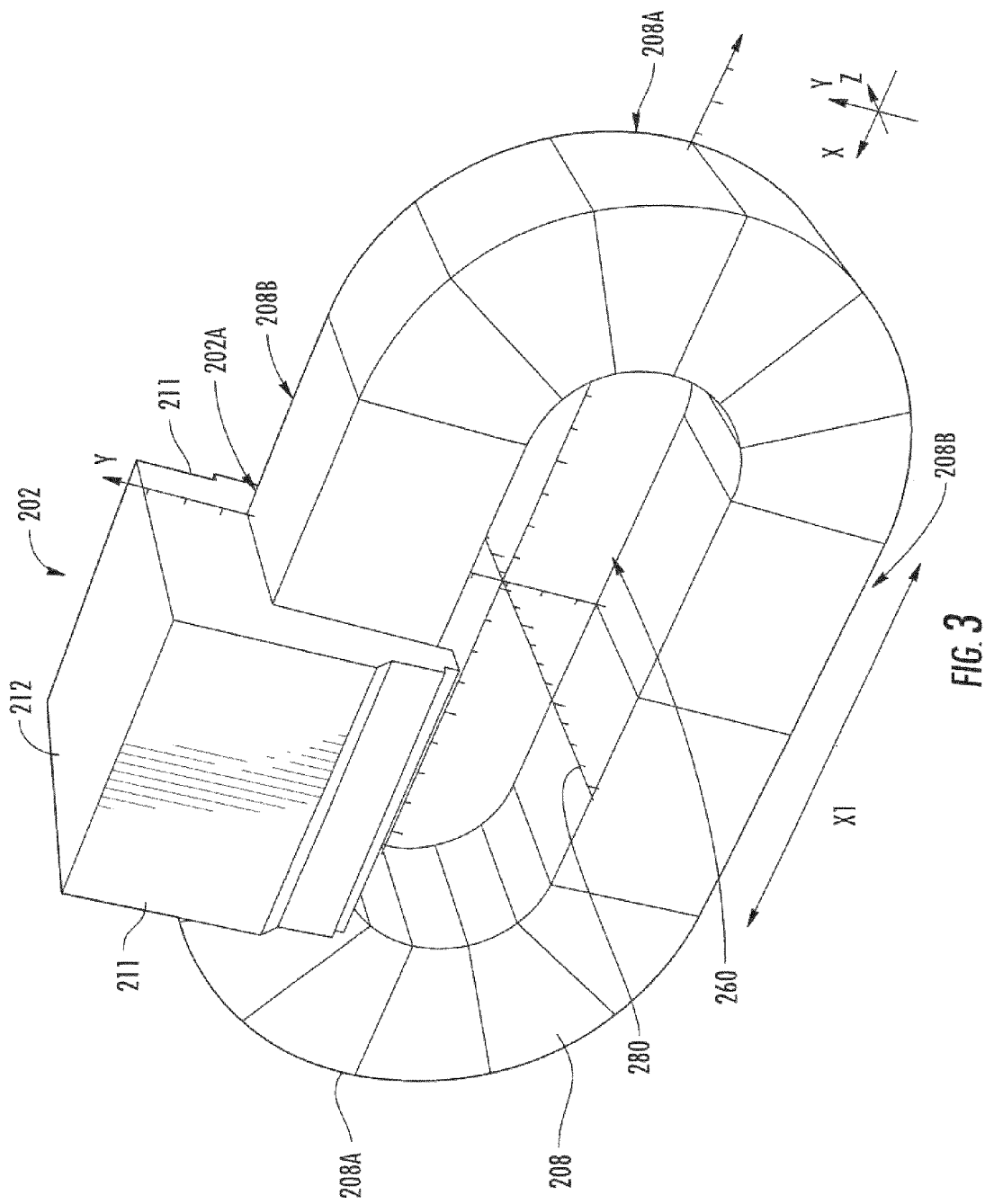
FIG. 3 is a partial perspective view of the first solenoid coil of FIG. 2 in accordance with an embodiment of the present disclosure.

FIG. 3 illustrates a perspective view of first solenoid coil 208 and a cut-away portion of upper yoke 202. For ease of explanation, yoke 204 has been omitted. Solenoid coil 208 is defined by a pair of curved end sections 208A and a pair of straight sections 208B transversely disposed to form a "racetrack" shape defining opening 260 having a sufficient width in the X direction to receive ribbon beam 104. Each of the straight sections 208B have a dimension (X1) sized to accommodate extremely wide ribbon beams. For example, dimension X1 may be about 60 centimeters (cm) with a distance between the straight portions 208B defining opening 260 in the Y direction of 26 cm. As mentioned earlier, coil 208 is wound around the Z axis to produce the desired magnetic field. Yoke 202 is defined by a pair of walls 211 extending in the Y direction and a transverse wall 212 extending in the Z direction integrally formed with walls 211 to define recess 202A within which coil 208 is disposed.

Figure 4:
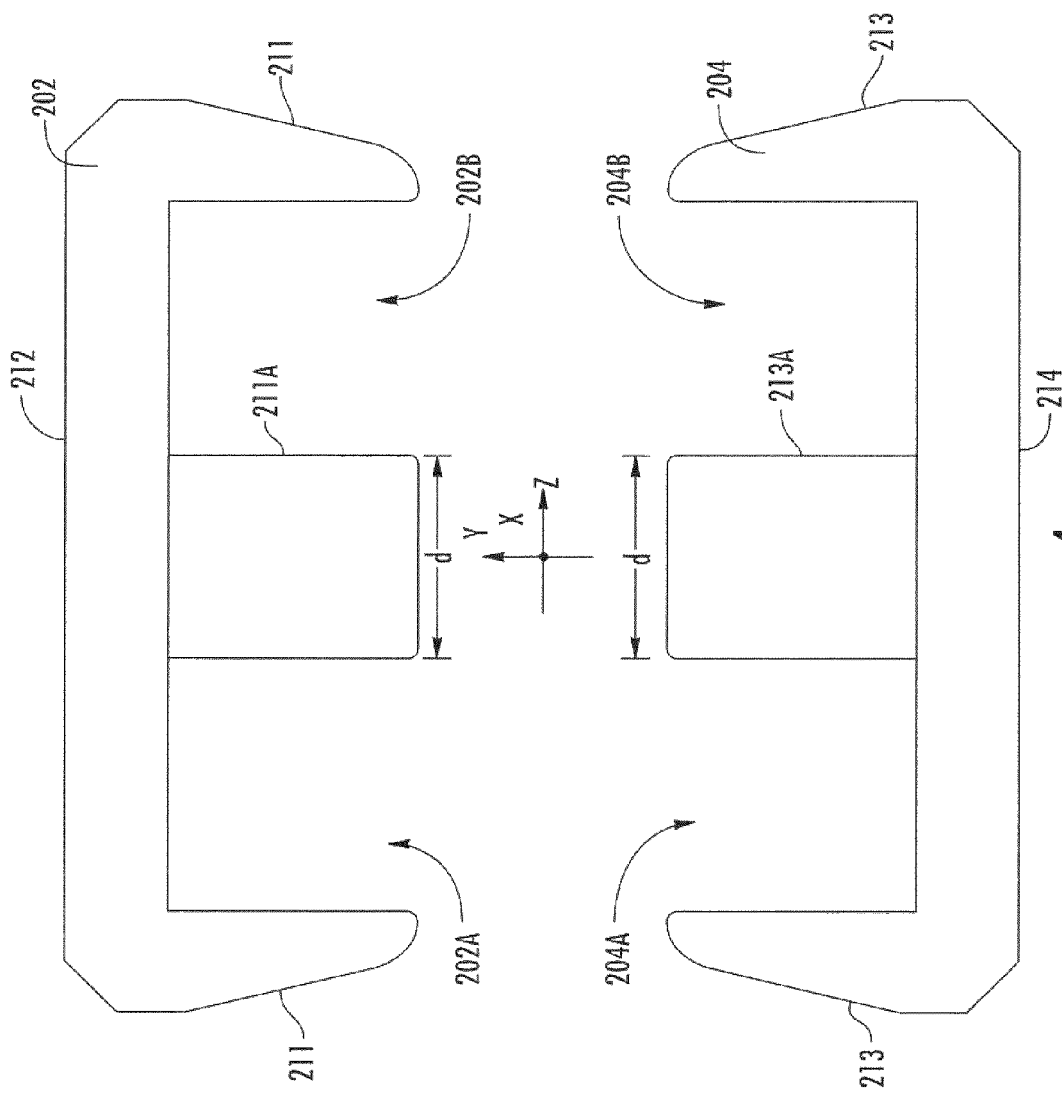
FIG. 4 is a side view of the return yokes of FIG. 2 in accordance with an embodiment of the present disclosure.

FIG. 4 is a side view of upper return yoke 202 and lower return yoke 204 with coils 208, 210 omitted for clarity of illustration. Upper yoke 202 is defined by walls 211 including a separation wall 211A having a width "d" corresponding to the separation distance between coils 208, 210 and a transverse wall 212. Similarly, yoke 204 is defined by walls 213 including a separation wall 213A having a width "d" corresponding to the separation distance between coils 208, 210 and a transverse wall 214. Recesses 202A and 204A are aligned to receive the corresponding straight portions of coil 208. Recesses 202B and 204B are aligned to receive the corresponding straight portions of coil 210. Although each of outer portions of walls 211 and 213 are illustrated as angled toward the respective separation walls 211A and 213A, alternative configurations of the wall structure for each of yokes 202, 204 may be employed to complete a circuit around coils 208, 210.

Figure 5A:
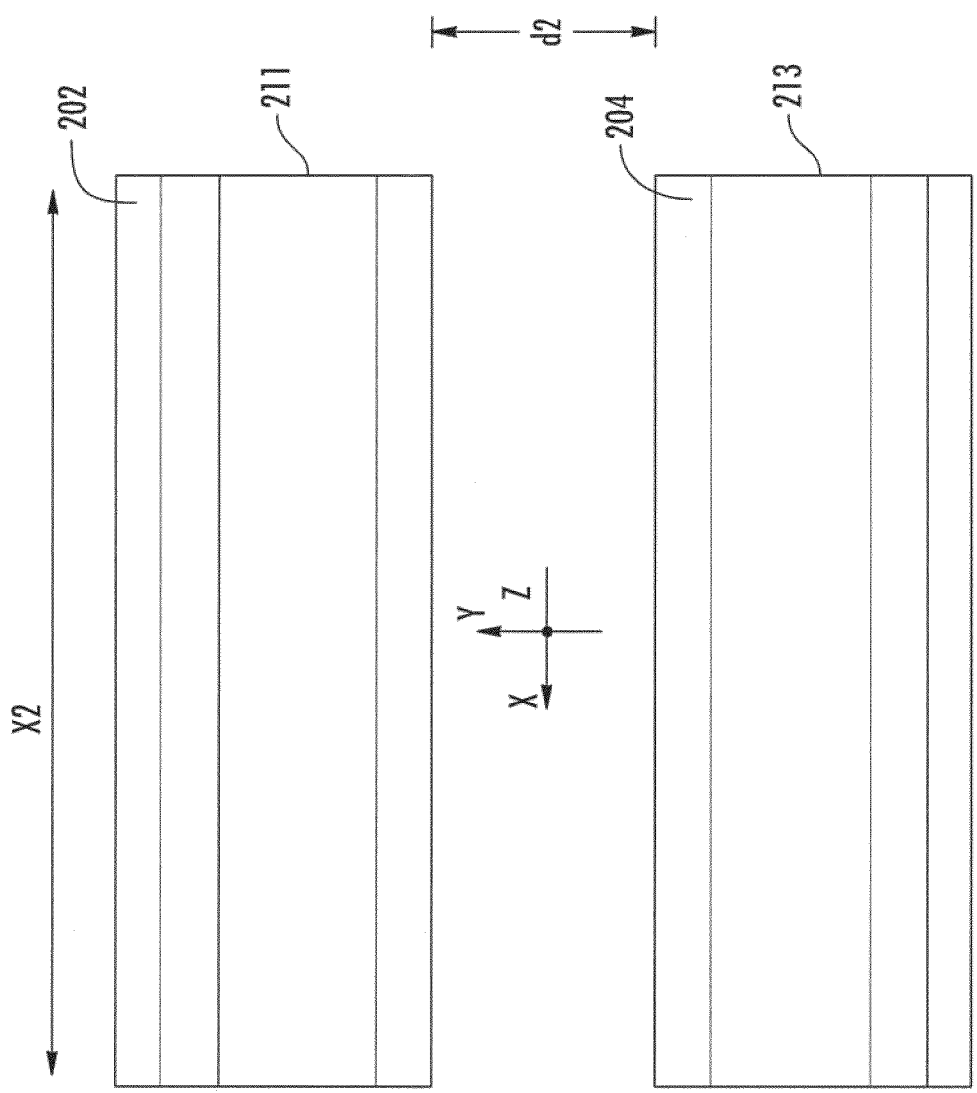
FIG. 5A is an end view of the return yokes of FIG. 2 in accordance with an embodiment of the present disclosure.

FIG. 5A is an end view from lines 1A-1A of FIG. 1 illustrating upper return yoke 202 and lower return yoke 204. The difference in the view shown in FIG. 5A corresponds to the change in X, Y and Z coordinates. Wall 211 extends the width (X direction) of upper yoke 202 a distance X2 and wall 213 extends the width of lower yoke 204 a corresponding distance X2. In an exemplary embodiment, dimension X2 may be about 92 cm. The distance "d2" is defined between upper yoke 202 and lower yoke 204 which corresponds to the distance between the straight sections of each of coils 208, 210 (and opening 260 shown in FIG. 3).

Figure 5B:
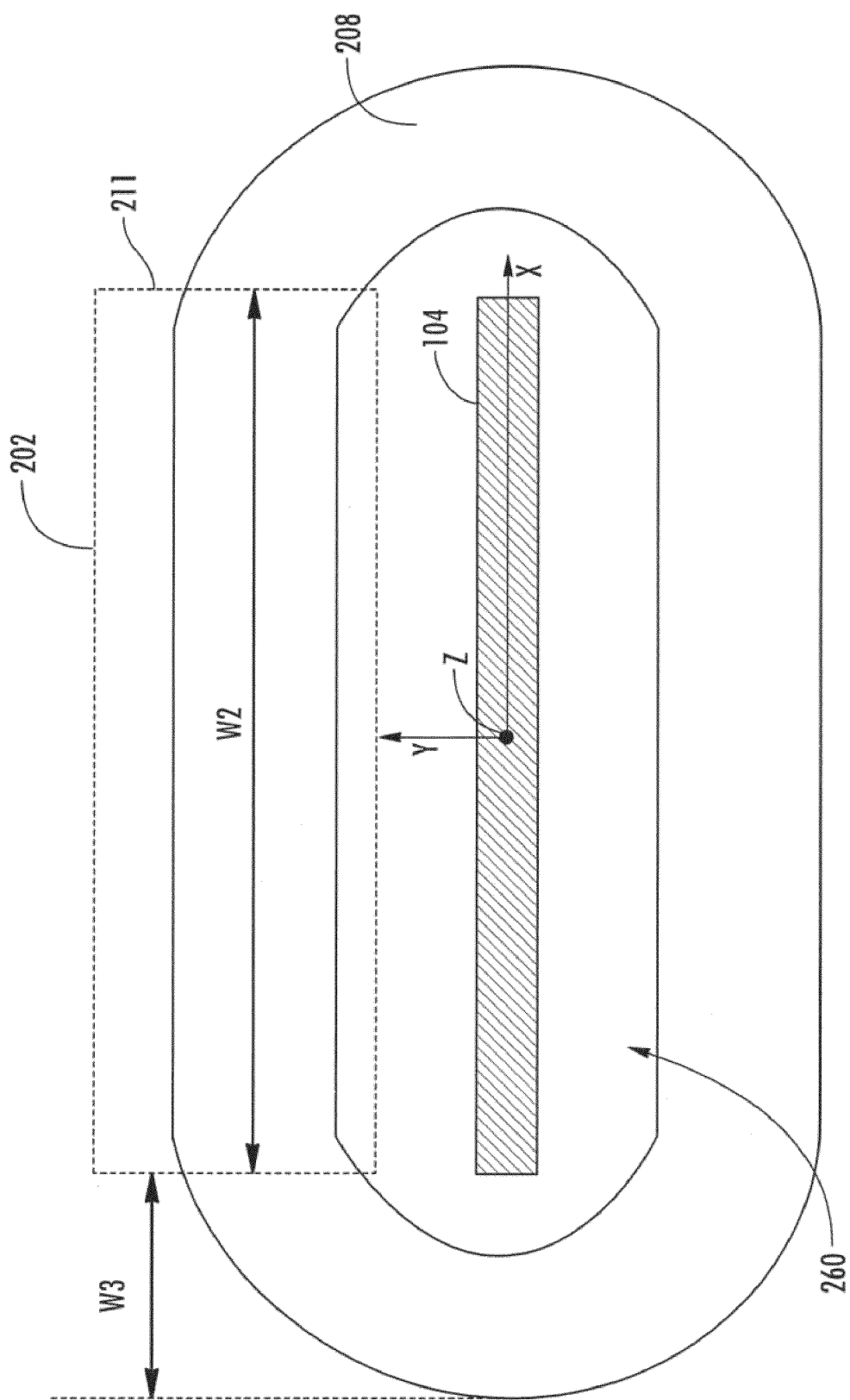
FIG. 5B is an end view of the entrance end of the analyzer of FIG. 2 in accordance with an embodiment of the present disclosure.

FIG. 5B is a plan view of the entrance of the analyzer 106 again taken along lines 1B-1B of FIG. 1 showing upper return yoke 202 in phantom and a cross sectional view of beam 104. First solenoid coil 208 defines opening 260 which receives ribbon beam 104 having a width in the X direction, height in the Y direction and traveling through the magnet 106 in the Z direction. The usable volume or "fill factor" along the X axis within the opening 260 should ideally be maximized. In order to minimize end effects on the magnetic field in opening 260 that would otherwise limit the width of the ribbon beam 104, the width (W2) of the upper return yoke 202 and lower return yoke (not illustrated) relative to the coil 208 can be optimized to provide a maximum usable volume within the opening 260. It has been found that by selecting the width (W2) of the return yokes 202, 204 to allow for a portion of the coils 208, 210 having width W3 extending beyond the dimensions of the return yokes, the usable volume of the coils 208, 210 in the X width dimension of the ribbon beam can be maximized.

Figure 6:
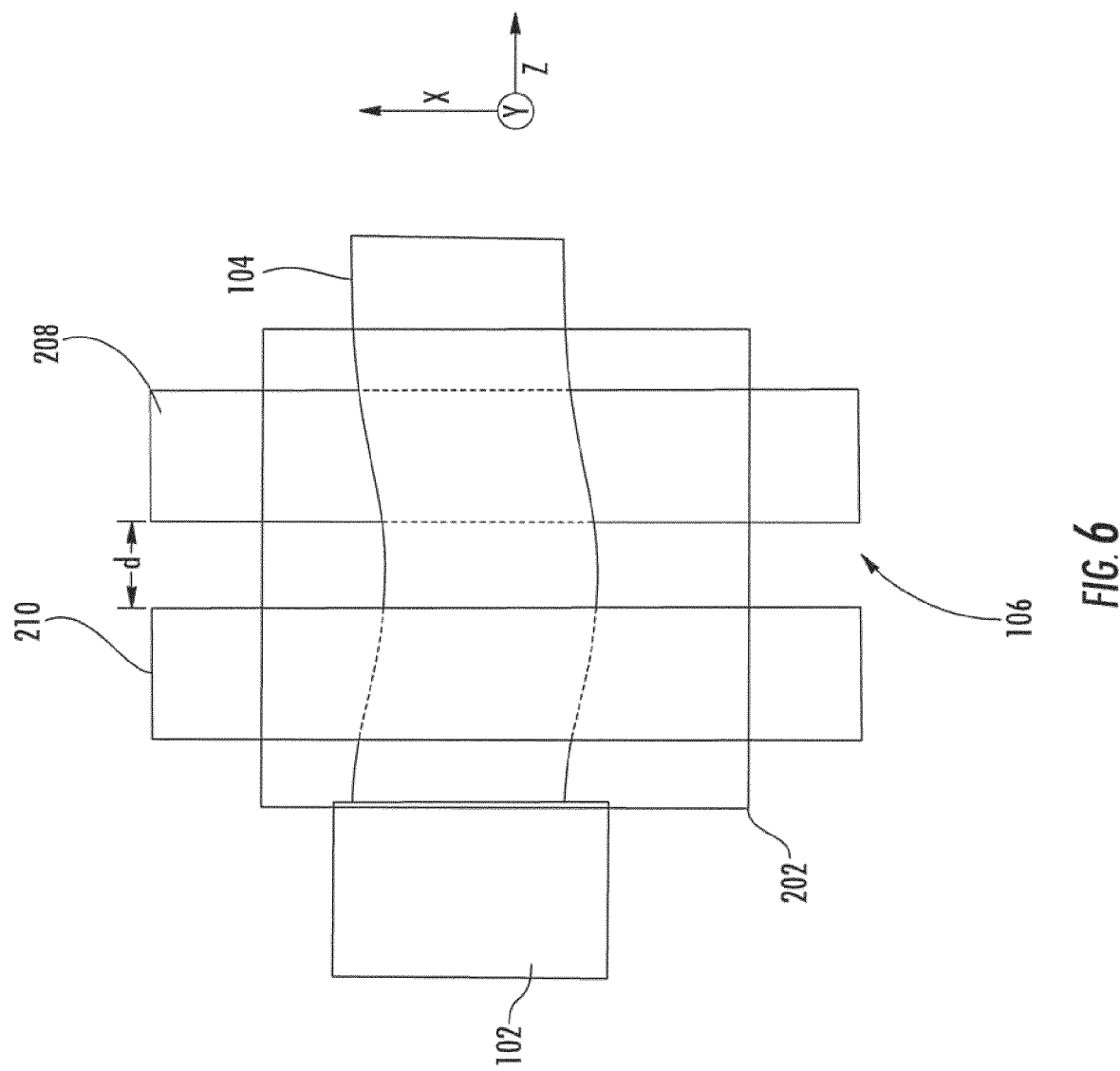
FIG. 6 is a top view of the analyzer of FIG. 2 illustrating the ion beam trajectory in accordance with an embodiment of the present disclosure.

FIG. 6 is a top view of analyzer 106 illustrating horizontal displacement (X direction) of the ribbon beam 104 in the first half of the analyzer 106 defined by coil 208 and an opposite horizontal (X direction) displacement in the second half of the analyzer 106 defined by coil 210. The beam 104 is then received by a mass slit to select the desired ions having a particular mass based on their respective trajectories in the Y direction as explained in FIG. 2. In this manner, the mirroring and cancellation of the displacements in the X direction in the first half and second half of the analyzer produced by the use of solenoids 208 and 210 split by a distance "d" enables a desirable output ribbon beam from the analyzer 106. In addition, by mirroring or cancelling displacement of the beam in the X direction, the overall width of the coils 208, 210 and consequently analyzer 106 is minimized while still maintaining a uniform magnetic field within the coils.

Figure 7:
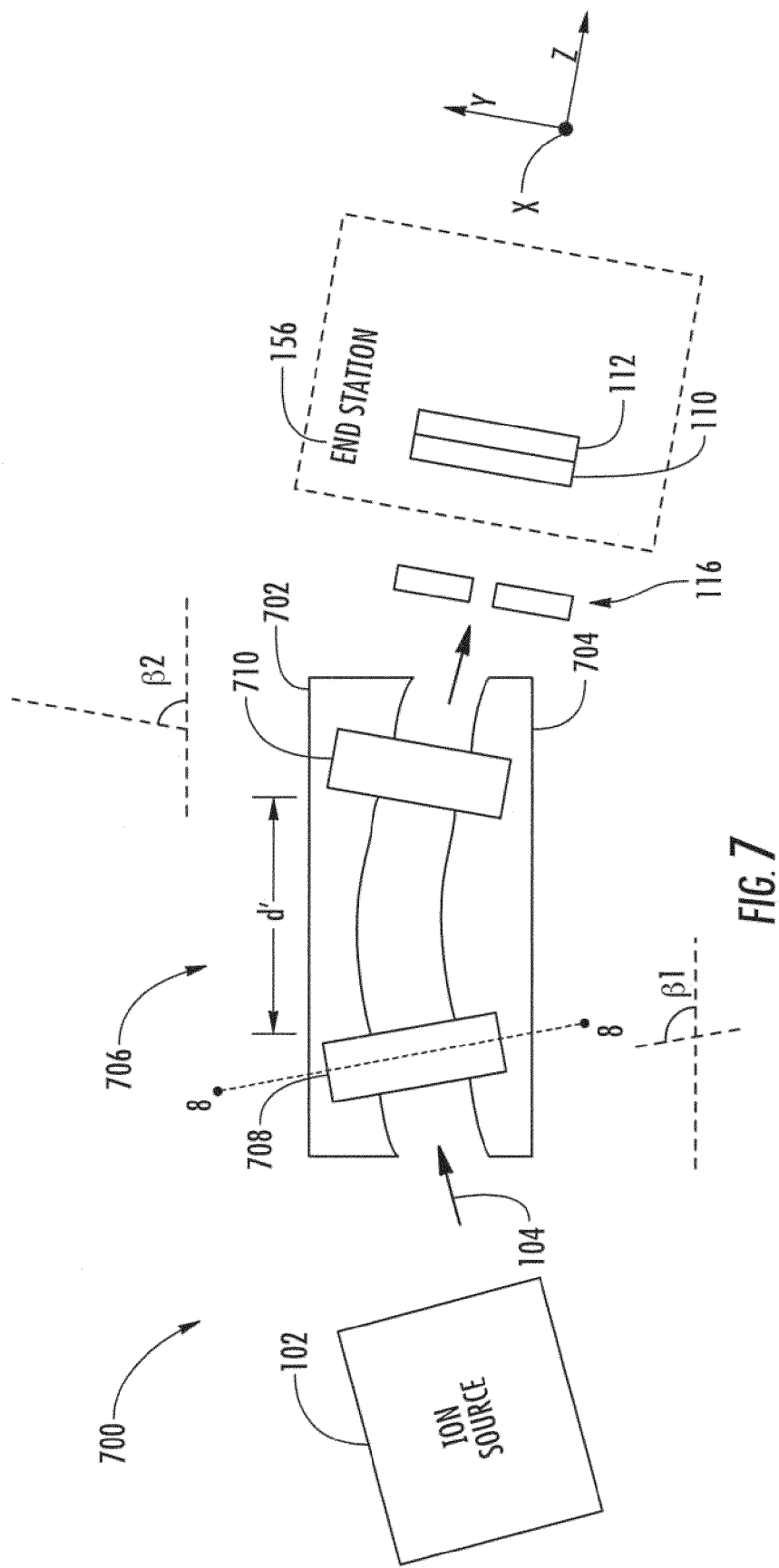
FIG. 7 is a side view of another embodiment of a ribbon beam mass analyzer having tilted solenoid coils in accordance with an embodiment of the present disclosure.

FIG. 7 is a block diagram side view of a simplified beamline ion implanter 700 including an ion source chamber 702 which generates ions of a desired species which is extracted to form a particular type of ion ribbon beam 104. A mass analyzer magnet 706 is disposed downstream of the ion source chamber 702 which includes a pair of solenoid coils 708, 710. A mass resolving slit 116 is configured to select ions having particular trajectories as they exit the mass analyzer magnet 706. An end station 156 includes a process chamber having a chuck 112 to support a workpiece 110 being treated by ribbon beam 104. The workpiece 110 may be a disk shaped semiconductor wafer in one embodiment.

Compared to the earlier embodiment shown in FIGS. 1-6, the analyzer magnet 706 in this alternative embodiment includes solenoid coils 708, 710 which are tilted an angle β1 and β2 with respect to one another to more closely conform to the path of ribbon beam 104. Each coil 708, 710 may be similarly partially disposed within recesses of upper return yoke 702 and lower return yoke 704 and separated by a distance d'. Each of the coils 708, 710 have a similar racetrack shape as coils 208, 210 described above. This increases the mass-energy product that the analyzer 706 can bend and resolve. In particular, tilting the solenoid coils to conform to the path of beam 104 allows the beam to travel through the analyzer 706 at a greater distance from the midplane without striking the upper wall of the magnet or vacuum vessel. As previously stated, the bending action of the solenoid lens increases with distance away from the midplane. Therefore, the tilted coil (708, 710) arrangement increases the bending power of the analyzer magnet 706, resulting in an increase of the mass-energy product that the analyzer can bend and resolve.

FIG. 8 is a perspective cross sectional view taken along lines 8-8 of a portion of mass analyzer magnet 706 shown in FIG. 7. A first solenoid coil 708 is disposed between upper return yoke 702 and lower return yoke 704. Upper return yoke 702 is defined by walls 711 extending in the Y direction connected by a transverse wall 712. A recess 702A is formed on the interior surfaces of walls 711, 712 and configured to receive an upper portion of coil 708. Similarly, lower return yoke 704 is defined by walls 713 extending in the Y direction connected by a transverse wall 714. A recess 704A is formed on the interior surfaces of walls 713, 714 and configured to receive an lower portion of coil 708. The direction of arrows shown within coil 708 illustrates the direction of the magnetic field in the X direction around the coil.

Figure 9:
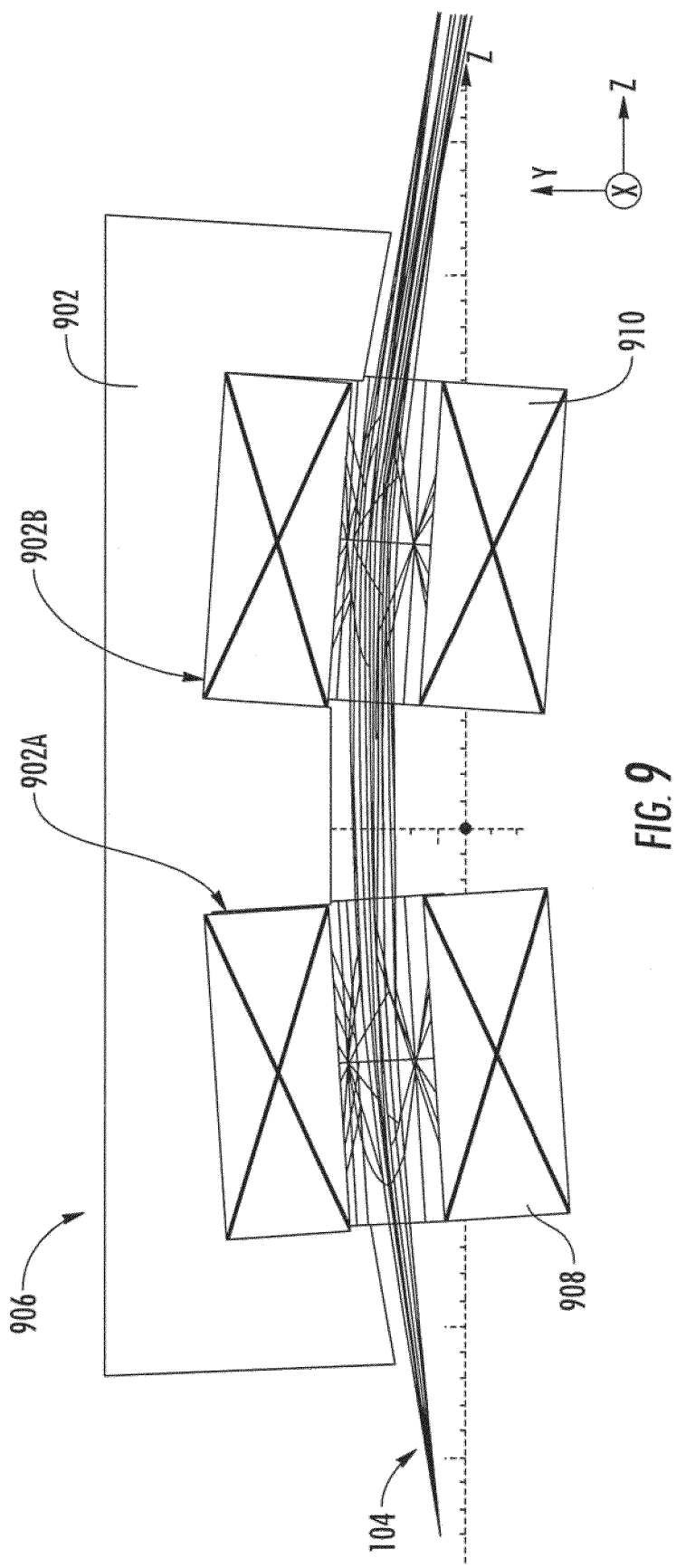
FIG. 9 is a side cross sectional view of yet another embodiment of a ribbon beam mass analyzer having solenoid coils tilted relative to one another and with a return yoke on only one side of the ribbon beam.

Turning to FIG. 9, a cross sectional side view of another embodiment of mass analyzer magnet consistent with the present disclosure. FIG. 9 illustrates a mass analyzer magnet 906 having bent or tilted solenoid coils 908, 910 relative to each other and the Y axis in a similar fashion as the embodiment of FIG. 7. However, the embodiment of FIG. 9 includes only an upper return yoke 902 with no lower return yoke. Solenoid coil 908 is disposed within recess 902A and solenoid coil 910 is disposed within recess 902B. This configuration provides acceptable beam optics and mass resolution, as well as a high mass energy product as beam 104 travels through mass analyzer magnet 906. With no lower return yoke, less ferrous material such as steel is necessary saving on component costs and installation. In addition, access to the interior vacuum vessels is improved. However, the removal of the lower return yoke permits higher magnetic fields in the region where the magnetic field may otherwise travel in the lower return yoke. This may be compensated for by the installation of proper shielding around the analyzer magnet and/or an enclosure for the implanter itself to ensure surrounding magnetic field safety standards are met.

Figure 10:
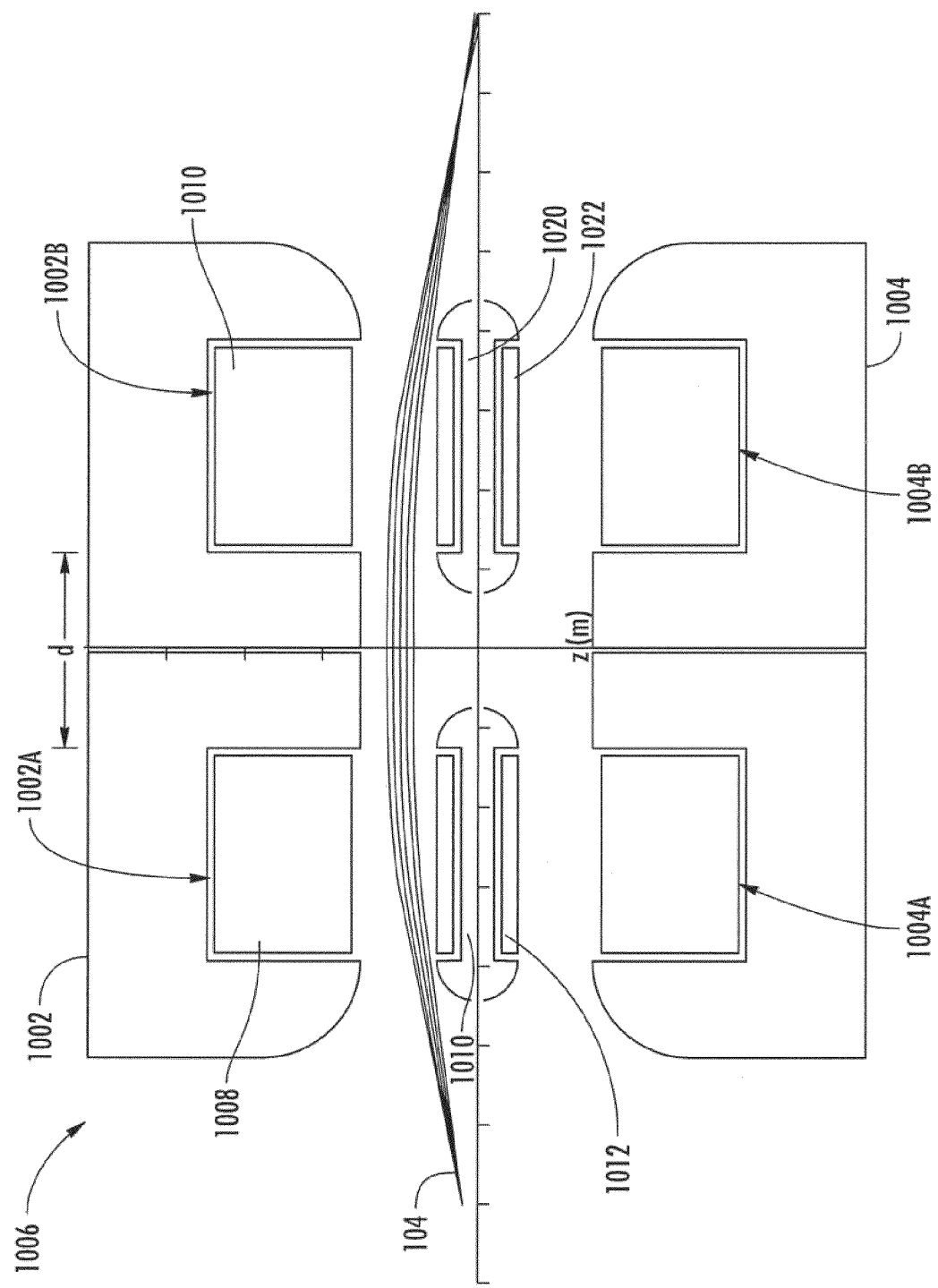
FIG. 10 is a side cross sectional view of yet another embodiment of a ribbon beam mass analyzer having additional return plates and coils positioned on axis of each half of the analyzer.

FIG. 10 is a side cross sectional view of yet another embodiment of a mass analyzer magnet 1006 comprising split solenoids 1008 and 1010. The analyzer magnet 1006 is similar to the side cross sectional view of the embodiment illustrated in FIG. 2 in that each of the solenoids 1008 and 1010 have a "racetrack" shape. However, the analyzer magnet of 1006 includes return plate (e.g., steel plates) and coil assemblies positioned on the axis of each half of the analyzer 1006. In particular, yoke 1002 includes a first recess 1002A and a second recess 1002E and yoke 1004 includes a first recess 1004A and a second recess 1004B. First solenoid 1008 is partially disposed within recess 1002A and 1004A of yokes 1002 and 1004 respectively. Second solenoid 1010 is partially disposed within recess 1002B and 1004B of yokes 1002 and 1004 respectively. Analyzer magnet 1006 is configured with a coil 1012 around steel plate 1020 positioned on the midplane axis within the space formed in solenoid 1008. A coil 1022 is configured around steel plate 1020 positioned on the midplane axis within the space formed in solenoid 1010. The coil and steel assemblies on the midplane axis function to redistribute the magnetic fields within each of the respective solenoids 1008, 1010. This reduces the optical aberrations and improves the quality of the position dependent image, thereby improving the separation of ions having different masses.

Figure 11:
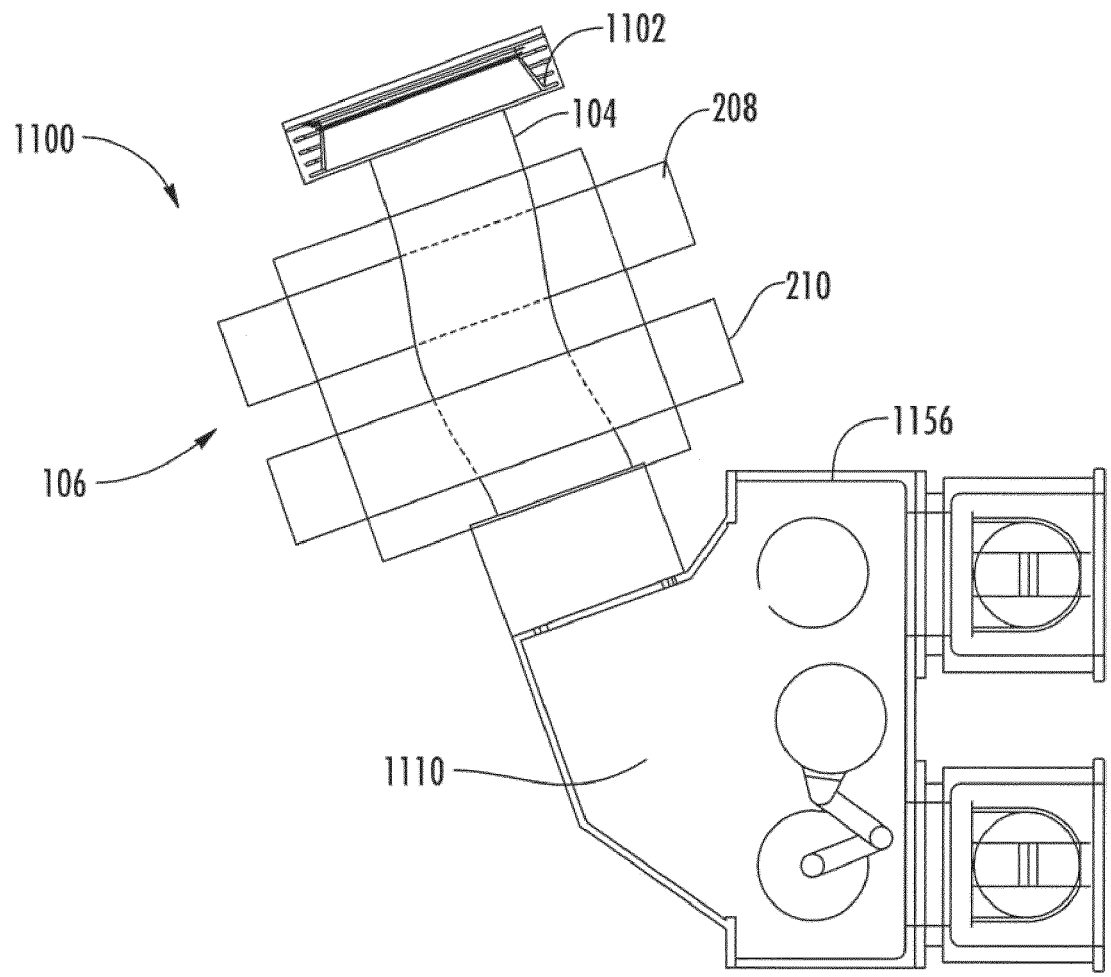
FIG. 11 is a top view of one ion implanter having a ribbon beam mass analyzer consistent with the present disclosure.
Figure 12:
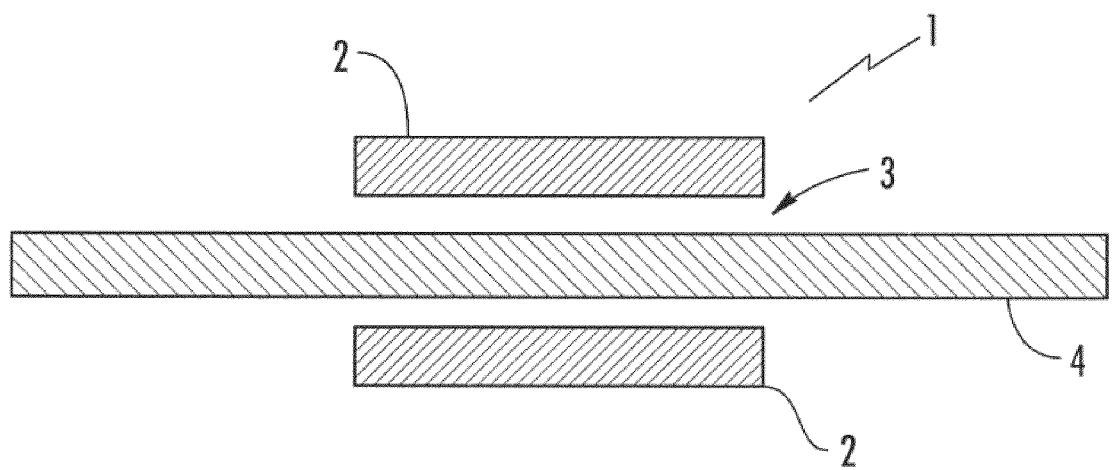
FIG. 12 is a side view of a prior art analyzer magnet.

FIG. 11 is a top view of a simplified ion implanter 1100 including an ion source 1102, mass analyzer 106 and end station 1156 consistent with the present disclosure. Ion source 1102 is configured to generate, plasma in an arc chamber having ions of a desired species. These ions are extracted from source 1102 to form a particular type of ion ribbon beam 104. The ions comprising ribbon beam 104 are mass analyzed by the ribbon beam mass analyzer 106 having a pair of split solenoid coils 208, 210 as earlier detailed. The solenoid coils 208, 210 are embedded in a steel return circuit defined by at least one yoke (not shown). Solenoid 208 is wound to produce an oppositely directed magnetic field as compared to solenoid 210. The mass analyzer 106 provides a uniform magnetic field across the width of ribbon beam 104 to accommodate wider ribbon beams. Based on the mass of the ions extracted from source 1102, a particular ion specie may be selected by the mass analyzer 106 and directed toward an end station 1156. The end station positioned downstream of mass analyzer 106 is configured to support one or more workpieces 1110 for treatment by the ribbon beam 104 comprising ions with a particular species.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Further, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes.

What is claimed is:

1. An ion mass analyzer for performing mass analysis of different ion species within a traveling ribbon ion beam and produce an image thereof, said analyzer comprising:
a first solenoid coil defining a space through which an ion ribbon beam passes, said first solenoid coil configured to generate a first magnetic field in a first direction in response to an applied current to alter trajectories associated with ions within said ion ribbon beam traveling through said to space of said first solenoid coil based on a respective mass of each of said ions;

a second solenoid coil spaced a distance "d" downstream from said first solenoid coil in the direction of said traveling ion ribbon beam, said second solenoid coil defining a space through which said ion ribbon beam received from said first solenoid coil travels, said second solenoid coil configured to generate a second magnetic field in response to applied current such that said second magnetic field is in an opposite direction from said first magnetic field; said second solenoid coil configured to further bend the trajectory of the ions received within said ion ribbon beam from the first solenoid coil based on the respective mass of each of said ions;

at least one yoke having a first recess and a second recess, said first recess configured to receive a portion of said first solenoid coil and the second recess configured to receive a portion of said second solenoid coil, said yoke connected to said first and second solenoid coils to complete a circuit formed between said yoke, said first solenoid coil and said second solenoid coil.

2. The ion mass analyzer of claim 1 wherein said first solenoid coil has a midplane defined within said space, said ion ribbon beam received in said space of said first solenoid coil disposed a distance away from said midplane.

3. The ion mass analyzer of claim 1 wherein said second solenoid coil has a midplane defined within said space, said ion ribbon beam received by said second solenoid coil from said first solenoid coil a distance away from said midplane.

4. The ion mass analyzer of claim 1 wherein each of said first and second solenoid coils having a respective upper portion and a lower portion, said first and second recess of said yoke configured to receive the upper portion of each of said first and second solenoid coils.

5. The ion mass analyzer of claim 4 wherein said yoke is a first yoke, said mass analyzer further comprising a second yoke having a first and second recess configured to receive a respective lower portion of each of said first and second solenoid coils.

6. The ion mass analyzer of claim 1 wherein said first solenoid coil having a first and second curved portions and first and second substantially straight portions connecting said first and second curved portions, said first and second curved portions and said first and second substantially straight portions defining said entrance and exit spaces.

7. The ion mass analyzer of claim 1 wherein said second solenoid coil having a first and second curved portions and first and second substantially straight portions connecting said first and second curved portions, said first and second curved portions and said first and second substantially straight portions defining said entrance space of said second solenoid coil.

8. The ion mass analyzer of claim 6 wherein said ribbon beam has a width, said first and second substantially straight portions of said first solenoid coil having a length greater than said ribbon beam width.

9. The ion mass analyzer of claim 7 wherein said ribbon beam has a width, said first and second substantially straight portions of said second solenoid coil having a length greater than said ribbon beam width.

10. The ion mass analyzer of claim 6 wherein said yoke has a width substantially equal to said length of said first and second substantially straight portions of said first solenoid coil.

11. The ion mass analyzer of claim 9 wherein said yoke has a width substantially equal to said length of said first and second substantially straight portions of said second solenoid coil.

12. The ion mass analyzer of claim 1 further comprising:
a vacuum vessel having at least one wall disposed along the path of the ion ribbon beam through the spaces defined by said first and second solenoid coils; and
a scraper extending orthogonally a distance from said at least one vessel wall, said scraper configured to prevent ions having a particular mass from passing through the space of said second solenoid coil.

13. The mass analyzer of claim 1 wherein said ribbon beam travels through the respective spaces of said first and second solenoid coils in a first direction, said first and second solenoid coils are configured orthogonally with respect to said first direction.

14. The mass analyzer of claim 1 wherein said ribbon beam travels through the respective spaces of said first and second solenoid coils in a first direction and at a reference angle, said first solenoid coil being angled (β1) with respect to said reference angle.

15. The mass analyzer of claim 1 wherein said ribbon beam travels through the respective spaces of said first and second solenoid coils in a first direction and at a reference angle, said second solenoid coil being angled (β2) with respect to said reference angle.

16. The mass analyzer of claim 2 further comprising:
a first plate and coil assembly positioned along the midplane within the space defined by the first solenoid coil; and
a second plate and coil assembly positioned along the midplane within the space defined by the second solenoid coil.

17. An ion implantation system comprising:
an ion source operable to generate a ribbon ion beam;
a mass analyzer having an entrance and an exit configured to receive a traveling ion ribbon ion beam from the ion source via the entrance and deflect ions within the ribbon beam having a desired charge-to-mass ratio along a predetermined path for output to the exit of the mass analyzer, said mass analyzer comprising:
a first and second solenoid coils spaced a specified distance apart, each of said solenoid coils defining a space through which said ribbon ion beam travels; and
a yoke having a first recess adapted to receive a first portion of said first solenoid coil and a second recess adapted to receive a first portion of said second solenoid coil; and
an end station downstream of the mass analyzer configured to support a workpiece for implantation thereof via the ribbon beam.

18. The ion implantation system of claim 17 wherein the first and second solenoid coils generate a uniform magnetic field through which the ribbon ion beam travels.

19. The ion implantation system of claim 17 wherein the first solenoid coil defines a first space through which the ribbon beam travels.

20. The ion implantation system of claim 17 wherein the second solenoid coil defines a first space through which the ribbon beam travels.

21. The ion implantation system of claim 17 wherein the yoke is a first yoke, the ion implantation system further comprising a second yoke having a first recess configured to receive a second portion of said first solenoid coil and a second recess configured to receive a second portion of said second solenoid coil.

22. The ion implantation system of claim 17 wherein said first solenoid coil has a midplane defined within said space, said ion ribbon beam received in said space of said first solenoid coil disposed a distance away from said midplane.

23. The ion implantation system of claim 17 wherein said mass analyzer further comprising:
   a vacuum vessel having at least one wall disposed along the path of the ion ribbon beam through the spaces defined by said first and second solenoid coils; and
   a scraper extending orthogonally a distance from said at least one vessel wall, said scraper configured to prevent ions having a particular mass from passing through the space of said second solenoid coil.

24. The ion implantation system of claim 17 further comprising a mass slit disposed between said mass analyzer and said end station, said mass slit configured to select ions from the ion ribbon beam having a particular mass and trajectory as the ions exit the mass analyzer.

25. The ion implantation system of claim 17 wherein said first solenoid coil is configured to generate a first magnetic field in a first direction in response to an applied current to alter trajectories associated with ions within said ion ribbon beam traveling through said space of said first solenoid coil based on a respective mass of each of said ions.

26. The ion implantation system of claim 25 wherein said second solenoid coil is configured to generate a second magnetic field in a second direction in response to the applied current such that said second magnetic field is opposite from said first magnetic field; said second solenoid coil configured to further bend the trajectory of the ions received within said ion ribbon beam from the first solenoid coil based on the respective mass of each of said ions as the ribbon beam travels through said second solenoid coil.

27. The ion implantation system of claim 23 wherein at least one wall is a first wall, said vacuum vessel further comprising a second wall, said scraper comprises a first portion extending from said at least one vessel wall and a second portion extending from said second wall, said first and second portions defining an aperture therebetween to further prevent ions having particular masses from passing through the space of said second solenoid coil.

* * * * *